United States Patent
Gao et al.

(10) Patent No.: US 6,930,610 B2
(45) Date of Patent: Aug. 16, 2005

(54) MONITORING SYSTEM AND METHOD FOR WIRING SYSTEMS

(75) Inventors: Guanzhong Gao, Schenectady, NY (US); Clive W. Reed, Scotia, NY (US); Charles S. Korman, Niskayuna, NY (US); Kenneth G. Herd, Niskayuna, NY (US)

(73) Assignee: General Electric Company, Niskayuna, NY (US)

(*) Notice: Subject to any disclaimer, the term of this patent is extended or adjusted under 35 U.S.C. 154(b) by 203 days.

(21) Appl. No.: 10/063,603

(22) Filed: May 3, 2002

(65) Prior Publication Data

US 2003/0206111 A1 Nov. 6, 2003

(51) Int. Cl.⁷ .............................................. G08B 21/00
(52) U.S. Cl. ...................... 340/635; 340/657; 324/536; 324/522; 324/547
(58) Field of Search ................................ 340/635, 657; 324/536, 522, 547

(56) References Cited

U.S. PATENT DOCUMENTS

| | | |
|---|---|---|
| 5,767,684 A | 6/1998 | Steennis |
| 5,854,556 A | 12/1998 | Steennis et al. |
| 5,982,181 A | 11/1999 | Rokunohe et al. |
| 5,986,860 A | 11/1999 | Scott |
| 5,991,137 A | 11/1999 | Krahn et al. |
| 6,078,180 A | 6/2000 | Jenkinson |
| 6,088,658 A | 7/2000 | Yazici et al. |
| 6,192,317 B1 | 2/2001 | Yazici et al. |
| 6,216,066 B1 | 4/2001 | Goebel et al. |
| 6,285,538 B1 | 9/2001 | Krahn |
| 6,297,645 B1 | 10/2001 | Erikkson et al. |
| 6,313,640 B1 | 11/2001 | Nasrallah et al. |
| 2001/0029433 A1 | 10/2001 | Scott |
| 2002/0097056 A1 | 7/2002 | Blades |
| 2002/0130668 A1 | 9/2002 | Blades |
| 2002/0183943 A1 | 12/2002 | Dollar, II |
| 2003/0151412 A1 * | 8/2003 | Gregory et al. ............. 324/536 |

FOREIGN PATENT DOCUMENTS

| | | |
|---|---|---|
| EP | 0407179 | 1/1991 |
| EP | 0424598 | 3/1996 |
| EP | 0740159 | 10/1996 |
| EP | 1174974 | 1/2002 |
| GB | 2233798 | 1/1991 |
| GB | 2348751 | 10/2000 |
| JP | 404034379 | * 5/1992 |
| WO | 0155740 | 1/2001 |
| WO | 0142802 | 6/2001 |

OTHER PUBLICATIONS

"ArcSafe Wiring Integrity Verification System", Assurance in Integrity, Pamphlet 2 pgs., General Dynamics, Redmond, Washington 98052–2540.
Search Report under Section 17.
AM Bruning and FJ Campbell, "Aging in Wire INsulation under Multifactor Stress", IEEE Transactions on Electrical Insulation, vol. 28, No. 5, Oct. 1993, pp. 729–754.

(Continued)

*Primary Examiner*—Julie Bichngoc Lieu
(74) *Attorney, Agent, or Firm*—Penny A. Clarke; Patrick K. Patnode

(57) ABSTRACT

A monitoring system includes at least one partial discharge (PD) sensor. The PD sensor is configured to monitor a component of an aircraft wiring system and to acquire a monitoring signal. A method embodiment for monitoring an aircraft wiring system includes acquiring a number of monitoring signals for a number of components of the aircraft wiring system using a number of partial discharge PD sensors. The method further includes conveying the monitoring signals from at least one of the PD sensors to a data acquisition system.

19 Claims, 9 Drawing Sheets

OTHER PUBLICATIONS

C. Furse and R. Haupt, "Down to the Wire", IEEE Spectrum, Feb. 2001, pp. 36–39.

C. Hutton, CW Reed and JE Timperley, "Use of Spectral Analysis and Phase Resolved Partial Discharge Measurements for Generator Testing", Annual Report of IEEE–DEIS Conference on Electrical Insulation and Dielectrc Phenomena, 1994, pp. 103–111.

P. Bonissone and K. Goebel, "Soft Computing for Diagnostics in Equipment Service.", Artificial Intelligence for Engineering Design, Analysis and Manufacturing, vol. 15 (4), Sep. 2001, pp. 267–279.

M. Fenger, SR Campbell and G. Gao, "The Impact of Surge Voltage Rise Time on PD Inception Voltage in Random Wound Motors of Different Designs," IEEE Conference on Electrical Insulation and Dielectgric Phenomena, 2001 Annual Report Conference, pp. 352–355.

G. Gao, M. Steinhauser and W. Chen, "Modern Testing Technology for Insulation System Development of Global VPIed Large Motors," International Conference on Properties and Applications of Dielectric Materials, Xi'an, China, 2000, pp. 961–966.

CW Reed, SF Philip, HM Schneider and M. Kawai, "Partial Discharge Inception and Breakdown Studies on Model Sheet–Wound, Compressed–SF6 Gas Impregnated Polymer Film–Insulated Windings," 1980, pp. 1–9.

K. Goebel, "Architecture and Design of a Diagnostic Information Fusion System," Artificial Intelligence for Engineering Design, Analysis and Manufacturing, Nov. 28, 2000, pp. 335–338.

CW Reed et al., Evaluation of Advanced Technologies for Power Transformers. Final Report, Part 2, Jun. 1, 1979–Jun. 30, 1981, US Department of Energy Contract #EC–77–C–01–2134, Jun. 1980.

* cited by examiner

US 6,930,610 B2

MONITORING SYSTEM AND METHOD FOR WIRING SYSTEMS

BACKGROUND OF INVENTION

The invention relates generally to condition monitoring and diagnostics of wiring systems and, more particularly, to condition monitoring and diagnostics of aircraft wiring systems using partial discharge analysis ("PDA").

An exemplary wire for an aircraft wiring system is shown in FIG. 1 and includes a conductive core, which is surrounded by insulation. The insulation may be surrounded by a sheath. There are three primary failure modes for wires in aircraft wiring systems: loose connectors, corrosion of a connecter, and damaged insulation. Damage to insulation takes two forms: material degradation due to aging or thermal/electrical environment, and chafing, which may occur during maintenance.

To detect wire failure in aircraft systems, wiring is presently monitored using either time or frequency domain reflectometry (TDR or FDR, respectively). Although these techniques improve upon simple impedance testing, by permitting identification and localization of hard wiring failures, they are unable to monitor degradation associated with the insulation and corrosion. Currently, degradation of insulation and corrosion are typically identified during visual inspection. Other shortcomings of TDR and FDR include the fact that they are performed offline, that is when the aircraft is out of service, their inability to predict wire failures and to identify potential sources of damage (electrical, thermal, mechanical, or environmental) that may lead to a wire failure on later flights, and their lack of sensitivity.

Adverse consequences of these inspection shortcomings include the expenditure of numerous man-hours for troubleshooting to identify sources of damage, as well as the removal and replacement of functioning equipment due to erroneous failure detection or prediction. Given the associated increased maintenance time and cost, there is a need for an improved monitoring system and method for aircraft wiring that is capable of monitoring the degradation associated with the insulation and corrosion, before failure occurs.

Partial discharge analysis has been successfully used to evaluate the integrity of high voltage insulation systems in the electrical industry. Briefly, partial discharges ("PD") are generated during the initial (and subsequent) stages of insulation breakdown, as well as in response to arcing between connectors, in a wide variety of electrical components, such as generators, transformers, capacitors, circuit board, wiring, and medical equipment. The analysis of partial discharges via spectrum analysis, phase resolution, or pattern recognition (or combinations thereof) is generally known as partial discharge analysis. By examining the evolution of partial discharges over time, failures can be predicted, and equipment failure can thus be avoided.

Accordingly, it would be desirable to develop a method and system for monitoring the condition of an aircraft wiring system that employ partial discharge analysis.

SUMMARY OF INVENTION

Briefly, in accordance with one embodiment of the present invention, a monitoring system is provided, which includes at least one partial discharge (PD) sensor. The PD sensor is configured to monitor a component of an aircraft wiring system and to acquire a monitoring signal.

A method embodiment for monitoring an aircraft wiring system is also provided. The method includes acquiring a number of monitoring signals for a number of components of the aircraft wiring system using a number of partial discharge PD sensors. The method further includes conveying the monitoring signals from at least one of the PD sensors to a data acquisition system.

BRIEF DESCRIPTION OF DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
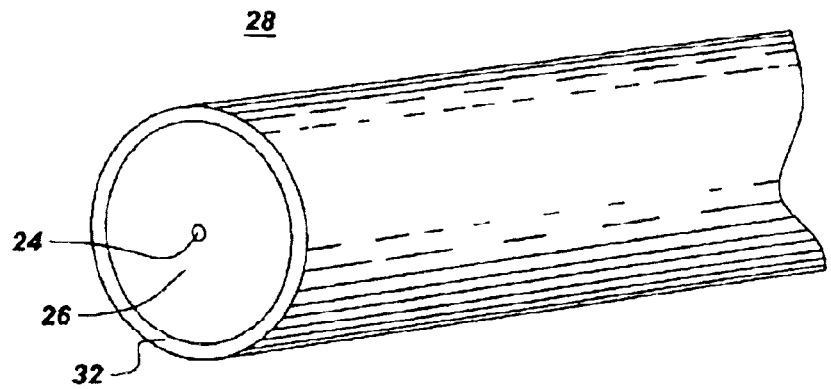
FIG. 1 illustrates an exemplary wire in an aircraft wiring system.

A monitoring system 100 embodiment of the invention is described with reference to FIG. 2. Monitoring system 100 includes at least one partial discharge (PD) sensor 10, which is configured to monitor a component 22 of an aircraft wiring system 130. Typical aircraft wiring system components are schematically depicted in FIG. 3. As shown in FIG. 3, exemplary components 22 include high voltage and high current power feeder circuits, subsystem power distribution circuits, and system and subsystem signal lines. On a more basic level, components 22 include wires 28, such as shown in FIG. 1. Partial discharges in aircraft wiring occur for frequencies within a range of about ten (10) kHz to about several hundred MHz and, in addition, occur at different positions on the oscillatory electric field (with different phase). More particularly, each aircraft wiring type will have a distinctive PD signature. For example, for 400 Hz power wiring, the PD signature is reflected in phase-resolved patterns, whereas the PD signature for dc voltages resides in the repetition rates and cumulative behavior. Exemplary PD sensors 10 include coupling capacitors, curtransformers, quadrapoles, voltage meadevices, preamplifier applications, isolation transformers, and active bridge adapters.

Figure 4:
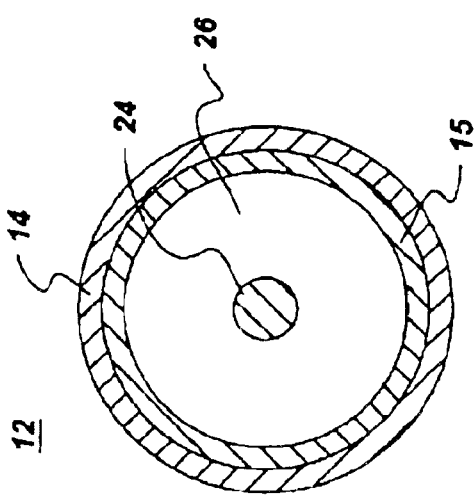
FIG. 4 illustrates a capacitive coupling sensor in cross-sectional view.

PD sensor 10 is described with respect to FIGS. 4–9. To maintain existing wiring integrity, PD sensor 10 for a particular embodiment includes a capacitive coupling sensor 12, which is illustrated in FIG. 4. As shown in FIG. 4, capacitive coupling sensor 12 includes a conductive layer 14 encompassing component 22. According to a more particular embodiment, component 22 includes a conductive core 24 surrounded by an insulating layer 26. For this embodiment, capacitive coupling sensor 12 further includes a capacitance enhancing layer 15, which extends around layer 26, as shown in FIG. 4. Conductive layer 14 extends around capacitance enhancing layer 15, as shown for example in FIGS. 4 and 6. Wires 28 generally include a sheath 32 as indicated in FIG. 1, and capacitance enhancing layer 15 also encompasses sheath 32 (not shown in FIG. 4). Hereinafter, it will be understood that if wire 28 includes sheath 32, any element that encompasses wire 28 also surrounds sheath 32. Exemplary materials for conductive layer 14 include copper and modern carbon black blends dispersed in a flexible polymer matrix, which possess long-term electrical and thermal stability, and for capacitance enhancing material include high dielectric strength polymer films, with or without high dielectric permittivity fillers, such as $TiO_2$, $Al_2O_3$, and titanates. For this embodiment, conductive core 24, insulating layer 26, capacitance enhancing layer 15, and conductive layer 14 form a capacitor, with conductive core 24 and insulating layer 26 providing an inherent electrode and dielectric, respectively, with capacitance enhancing layer 15 enhancing the capacitance of the capacitor, and with conductive layer 14 providing the applied electrode. By enhancing the capacitance of capacitive coupling sensor 12, capacitance enhancing layer 15 reduces the size (area) requirement for capacitive coupling sensors 12. Beneficially, the single-wire configuration shown in FIG. 6 facilitates quick isolation of a partial discharge indication for a specific wire 28.

Figure 5:
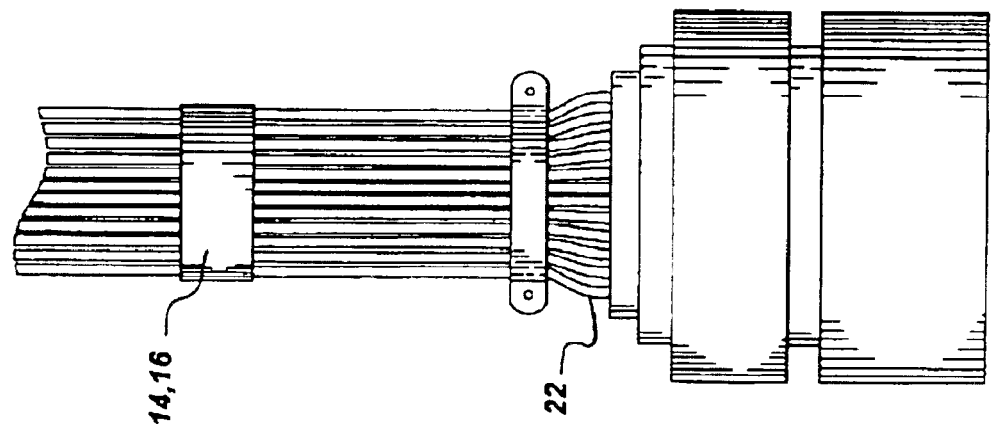
FIG. 5 illustrates a PD sensor in a bundled configuration.

According to another embodiment, which is illustrated in FIG. 5, component 22 includes a number of wires 28, each wire comprising a conductive core 24 surrounded by an insulating layer 26. For this embodiment, capacitive enhancing layer 15 extends around wires 28, bundling wires 28 together, and conductive layer 14 extends around capacitance enhancing layer 15, as indicated in FIG. 5. The bundled configuration illustrated in FIG. 5 facilitates monitoring a large number of wires 28.

Figure 6:
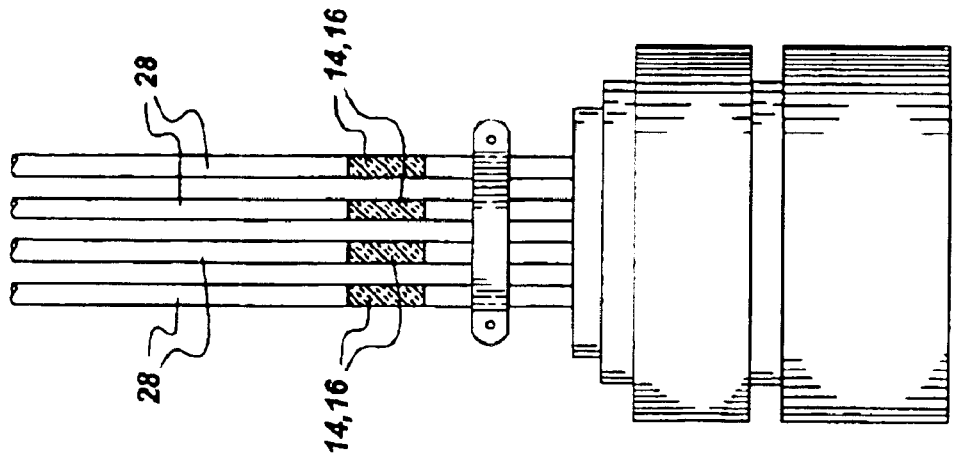
FIG. 6 illustrates a number of PD sensors, in a single wire configuration.
Figure 7:
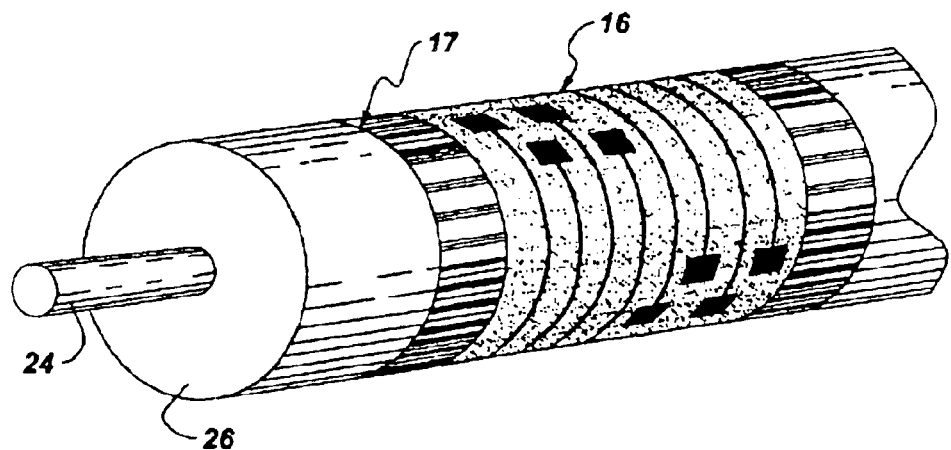
FIG. 7 illustrates a high frequency current transformer (HFCT) sensor.
Figure 8:
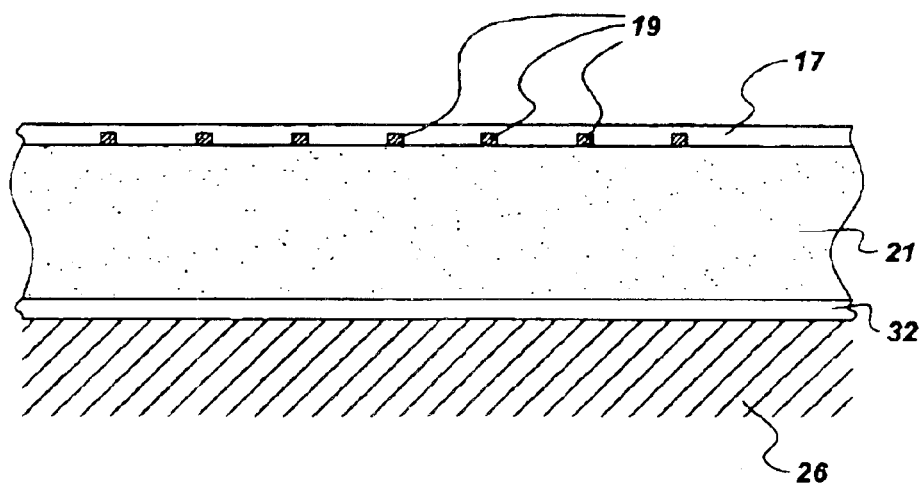
FIG. 8 depicts the HFCT sensor of FIG. 7 in partial cross-sectional view.

Another embodiment of PD sensor 10 is described with respect to FIGS. 7 and 8. For this embodiment, PD sensor 10 includes a high frequency current transformer (HFCT) sensor 16 encompassing component 22. Where component 22 includes conductive core 24 surrounded by insulating layer 26, HFCT sensor 16 extends around insulating layer 26, as indicated in FIG. 7. As noted above, wires 28 typically include sheath 32 and those skilled in the art will recognize that HFCT sensor 16 extends around sheath 32. HFCT sensor 16 can be configured in a single wire arrangement, as shown in FIG. 6, for example, providing wire differentiation. For another embodiment, HFCT sensor 16 extends around a number of wires 28, as shown in FIG. 5, in a bundled configuration. An exemplary HFCT sensor 16 is depicted in FIG. 8, in partial cross-sectional view. As shown in FIG. 7, HFCT sensor 16 includes a number of conductive leads 19 formed on substrate 21. Cap 17 covers leads 19 and substrate 21. According to a particular embodiment, substrate 21 comprises a flexible, magnetic, high permeability material. Exemplary substrates 21 comprise polymers with magnetic particles (for example, iron) dispersed therein. Exemplary conductive leads 19 comprise copper. According to a particular embodiment, cap 17 comprises a flexible material, for example a polymer film. Exemplary caps 17 comprise polymer films marketed under the trade names Ultem®, Radel®, or Teflon®, suitably metallized. In addition, cap 17 may further include fillers with high permittivity to increase capacitance and reduce size. Beneficially, both capacitive coupling sensor 12 and HFCT sensor 16 incorporate a non-intrusive approach that maintains existing wiring integrity, to reduce the possibility of inducing failures during sensor installation and operation.

Figure 9:
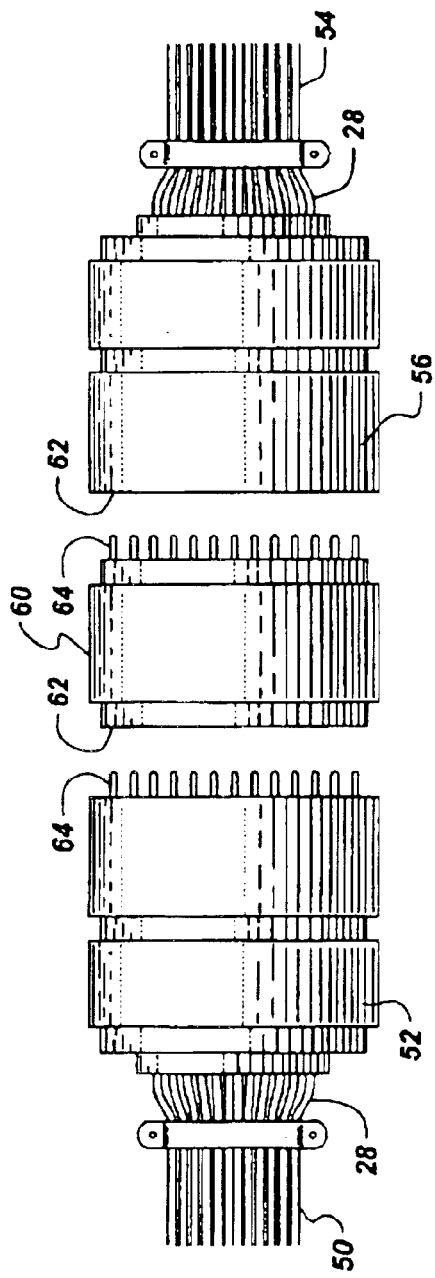
FIG. 9 illustrates an in-line monitoring unit.

According to a particular embodiment, monitoring system 100 further includes a monitoring unit 60, 65, which includes PD sensor 10. Exemplary monitoring units 60, 65 are described with reference to FIGS. 9 and 10. In order to retrofit existing aircraft wiring systems 130, an in-line monitoring unit 60 is provided. For this embodiment, component 22 comprises a first wire set 50 including at least one wire 28, a first connector 52 connected to first wire set 50, a second wire set 54 including at least one wire 28, and a second connector 56 connected to second wire set 54, as shown in FIG. 9. In-line monitoring unit 60 is positioned between first and second connectors 52, 56. According to a more particular embodiment, in-line monitoring unit 60 is configured to matingly connect to first and second connectors 52, 56, as indicated in FIG. 9. An exemplary in-line monitoring unit 60 includes at least one socket (not shown but indicated by reference numeral 62), for receiving a pin 64 of first connector 52, and at least one pin 64, for inserting within a socket 62 of second connector 56. Exemplary connectors 52, 56 include 24 pins 64 or sockets 62. Exemplary PD sensors 20 for this embodiment include capacitive coupling sensor 12 or HFCT sensor 16, which are configured around pins 64 of in-line monitoring unit 60. Beneficially, in-line monitoring unit 60 permits the monitoring of individual wires 28 for ready identification of the specific wire 28 generating a partial discharge. In addition, in-line monitoring unit 60 can be used with existing cable assemblies and thus is readily usable in retrofitting existing aircraft wiring systems 130.

Figure 10:
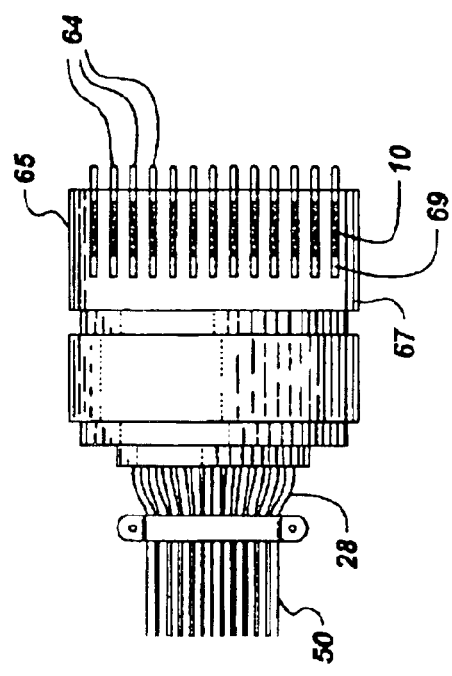
FIG. 10 illustrates a self-monitoring unit.

According to another embodiment, monitoring unit is a self-monitoring unit 65. This embodiment is beneficial for new or replacement components 22 of aircraft wiring systems 130. For this embodiment, component 22 includes a wire set 50, which includes at least one wire 28 and is connected to self-monitoring unit 65. PD sensor 20 is configured to monitor the wire. An exemplary self-monitoring unit 65 is illustrated in FIG. 10 and includes a connector 67, configured to connect to wire set 50, and a number of pins 64, for matingly connecting to another connector (not shown). For this embodiment, exemplary PD sensors 10 include capacitive coupling sensor 12 or HFCT sensor 16. PD sensor 10 is configured around a respective pin 64 on either a protruding portion or an interior portion 69, the latter configuration being depicted in FIG. 10. Self-monitoring unit 65 is particularly beneficial for incorporation into the electrical connectors of new cable assemblies, reducing added hardware and weight, and improving sensor reliability and durability. In addition, self-monitoring unit 65 permits the monitoring of individual wires 28 for ready identification of the specific wire 28 generating a partial discharge.

Figure 2:
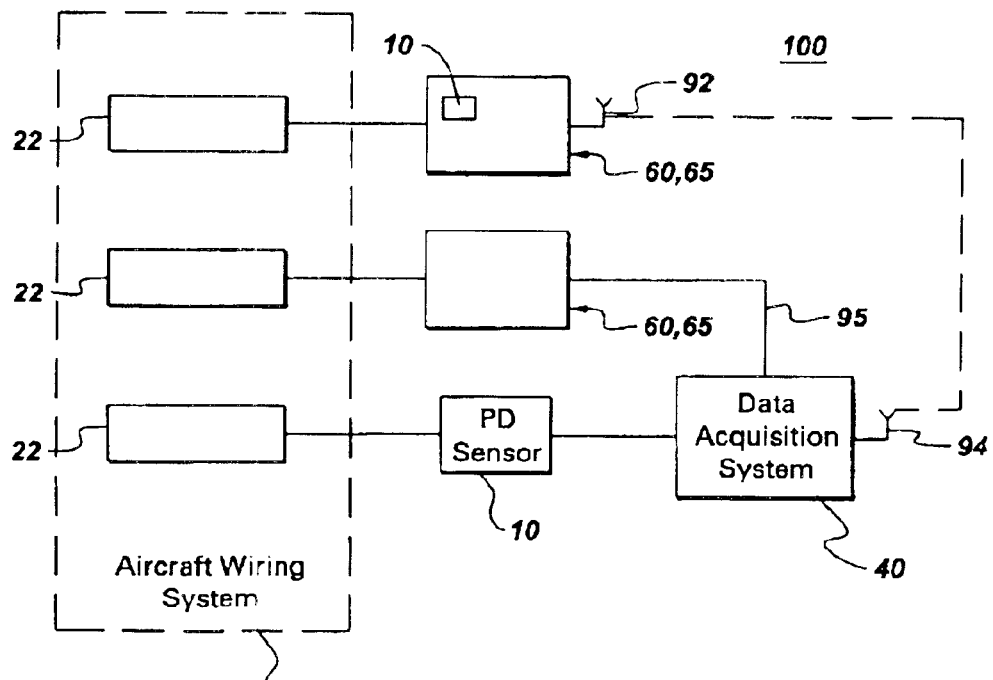
FIG. 2 illustrates a monitoring system embodiment of the invention.
Figure 3:
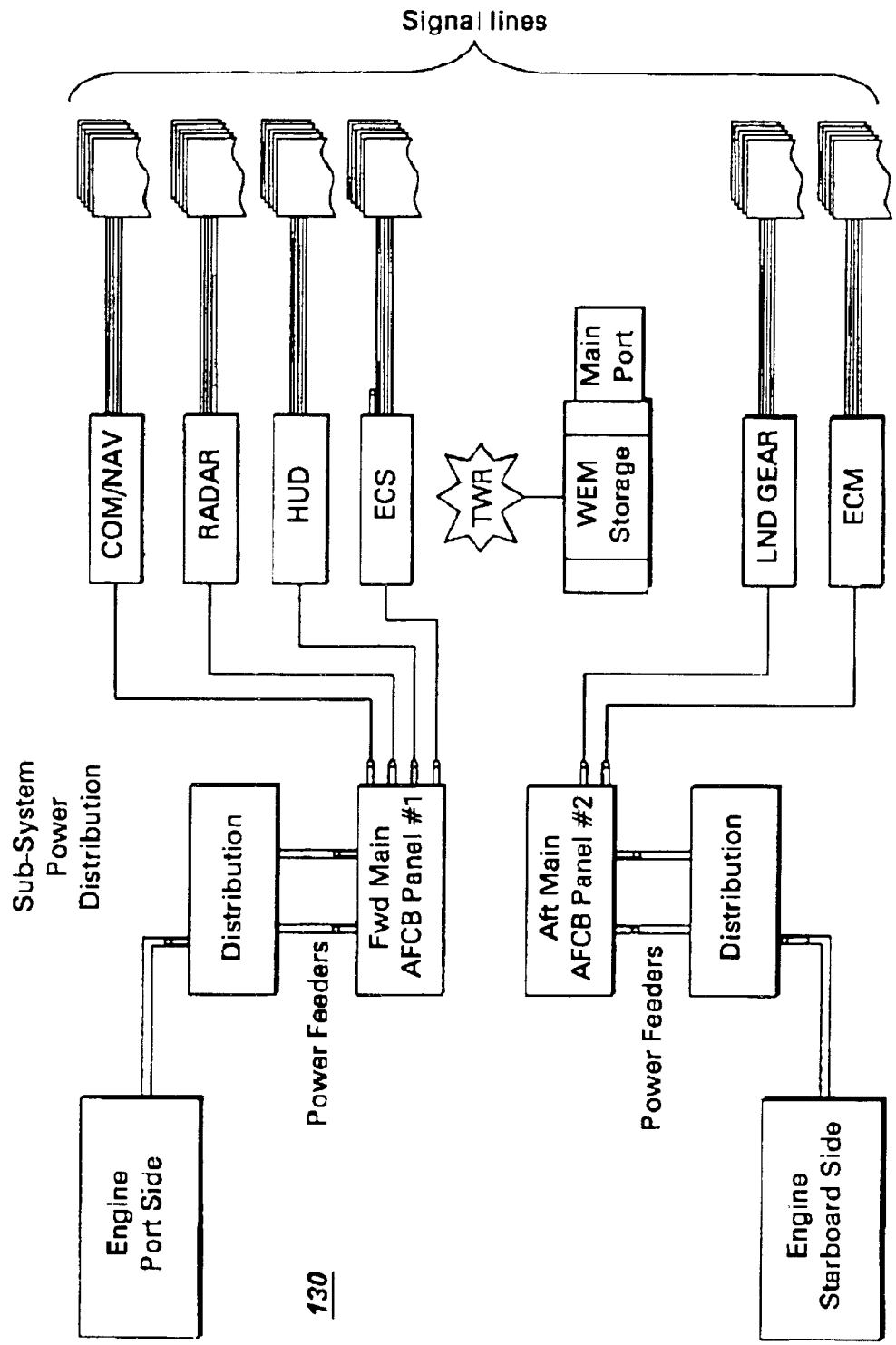
FIG. 3 schematically depicts typical aircraft wiring system components.

For the embodiment shown in FIG. 2, monitoring system 100 further includes a data acquisition system 40, which is configured to receive the monitoring signal from PD sensor 10. For a more particular embodiment for monitoring components 12 in critical aircraft systems, such as power feeder systems, monitoring system 100 further includes at least one hard-wired connector 95 configured to connect monitoring unit 60, 65 to data acquisition system 40 for conveying the monitoring signal.

Although hard wired connections 95 between monitoring unit 60, 65 and data acquisition system 40 can be desirable for monitoring critical components 95, it is also desirable to avoid increasing the overall number of wires 28. Accordingly, for a particular embodiment, monitoring unit 60, 65 further includes a transmitter 92, which is configured to transmit the monitoring signal as schematically indicated in FIG. 2. Transmitters are known and hence will not be discussed in detail. Transmitter 92 may take any of known forms, and one exemplary transmitter 92 is a radio-frequency transmitter. Beneficially, transmitter 92 provides a wireless interface also indicated by reference numeral 92 between monitoring unit 60, 65 and data acquisition system 40.

Figure 11:
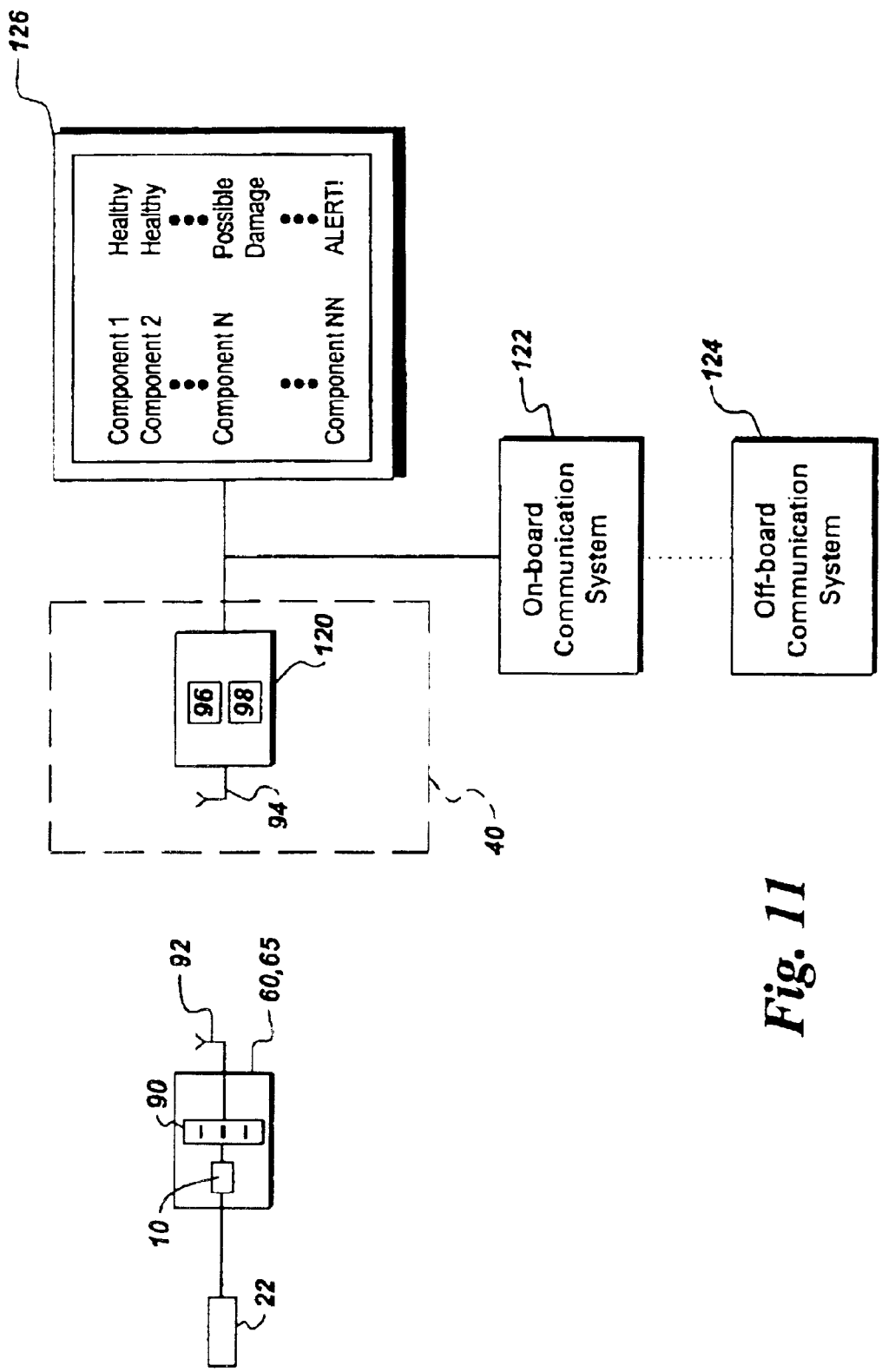
FIG. 11 depicts another monitoring system embodiment of the invention.

In order to receive and store the monitoring signal, for a particular embodiment depicted in FIG. 11, data acquisition system 40 includes a receiver 94, which is configured to receive the monitoring signal, and a memory 96, which is configured to store the monitoring signal. Receivers are known, and receiver 94 may take any of known forms. One exemplary receiver 94 is a radio-frequency receiver. One exemplary implementation of memory 96 is a computer 120. Computer 120 may be integral to the aircraft or take the form of a portable device. Alternatively, computer 120 may be off-board. Beneficially, by storing the monitoring signals, memory 96 permits additional post-flight analysis of the health of the aircraft wiring system. According to a particular embodiment, computer 120 is on-board the aircraft in either a fixed or portable configuration.

Figure 12:
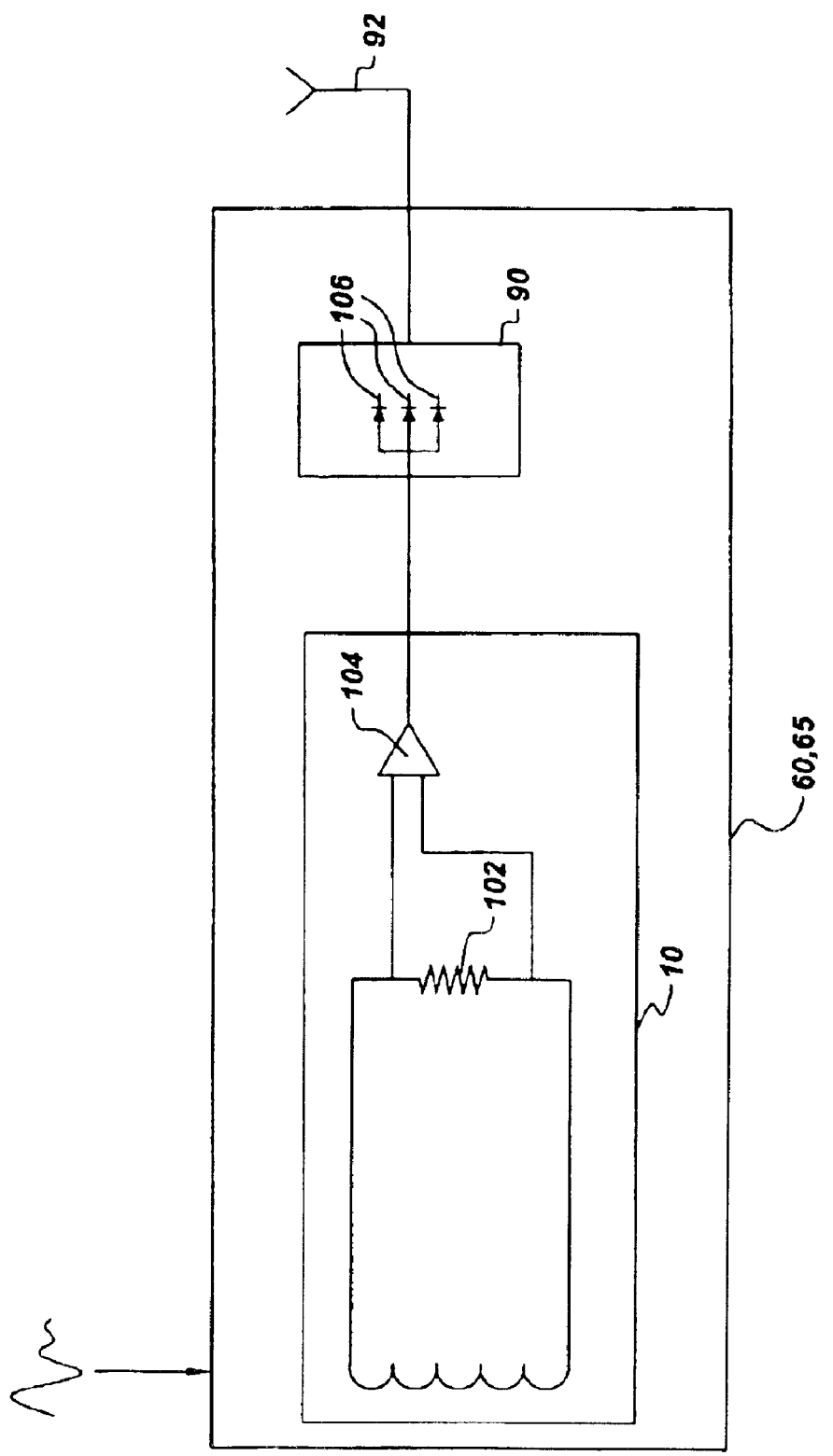
FIG. 12 depicts the monitoring unit of either FIG. 9 or 10 according to a particular embodiment.

In order to simplify monitoring of components 22 of aircraft wiring system 130 and to provide a quick means for detecting problematic wiring conditions and alerting personnel of such conditions, monitoring unit 60, 65 according to a particular embodiment further includes a partial discharge (PD) signal discriminator 90, which is configured to convert the monitoring signal to a multi-level monitoring signal. For this embodiment, transmitter 92 is configured to transmit the multi-level monitoring signal. Alternatively, the multi-level signals are conveyed to data acquisition system 40 via hard wire connections 95, as indicated in FIG. 2. An exemplary monitoring unit 60, 65 is described with reference to FIG. 12. As shown in FIG. 12, the monitoring signal is measured, for example, across a resistor 102. The signal is amplified by an amplifier 104. PD signal discriminator 90 includes a number of discriminating elements 106, for example diodes. Discriminating elements 106 pass the monitoring signal only if its amplitude exceeds certain predetermined values, for example $V_1=1.0$ mV and $V_2=1.5$ mV. These values are purely exemplary. Insulation materials exhibit different strengths and weaknesses regarding the onset and extent of degradation due to partial discharges. Accordingly, the predetermined values are selected based on the wiring being monitored, including the type of wiring insulation and the aircraft wiring system being monitored. Moreover, although this example is described using two predetermined values, $V_1$ and $V_2$ other numbers of predetermined values can also be used, for example three or four. Small partial discharges with amplitude V less than the smallest predetermined value, $V_1$, will not pass through any of discriminating elements 106. Accordingly, transmitter 92 transmits a low signal, indicating "healthy" wiring. A larger partial discharge with amplitude between $V_1$ and $V_2$, namely $V_2 \geq V \geq V_1$, will be passed by discriminating element 106 corresponding to $V_1$ and transmitter 92 transmits a medium signal akin to a yellow light or warning, indicating some breakdown and a possibility of future wiring damage. Still larger partial discharges with amplitude exceeding $V_2$ pass through discriminating element 106 corresponding to $V_2$, and transmitter 92 transmits a high signal analogous to a red light or high alert, indicating considerable breakdown and imminent damage to the wiring. Thus, the multi-level monitoring signal is one of the low, medium, or high signals, for this example.

In order to receive, store, and respond to the multi-level monitoring signals, data acquisition system 40 according to a particular embodiment includes receiver 94, which is configured to receive the multi-level monitoring signal, and memory 96, which is configured to store the multi-level monitoring signal. For this embodiment, data acquisition system 40 further includes a monitor 98, which is configured to transmit an alert based on the multi-level monitoring signal. One exemplary implementation of memory 96 and monitor 98 is a computer 120, which is discussed above and indicated in FIG. 11. Beneficially, by storing multi-level monitoring signals, memory 96 permits additional post-flight analysis of the health of the aircraft wiring system 130. As certain conditions that may induce in-flight failures may not be duplicated during ground maintenance activities, the storage of multi-level monitoring systems in memory 96 is particularly beneficial. According to a particular embodiment, computer 120 is on-board the aircraft in either a fixed or portable configuration. For this embodiment, monitor 98 is configured to transmit the alert to a communication system 122 of the aircraft, which in turn communicates with an off-board communication system 124 for land-based monitoring of the aircraft wiring system 130. For example, monitor 98 transmits the alert to a central warning system (also indicated by reference numeral 122) for the aircraft. Communications between aircraft and off-board communication systems 122, 124 are known. Communications between monitor 98 and on-board communications system 122 can be either wireless or hard-wired.

It is also desirable to display the wire health status, so that aircraft or ground personnel may visually monitor the health of components 22 of aircraft wiring system 130. According to a particular embodiment, monitoring system 100 further includes a display 126, which is configured to display a wire health status based on the multi-level monitoring signal. The invention is not limited to any particular type of display. Exemplary displays include computer monitors and liquid crystal displays. Display 126 may be part of a portable device of in a fixed configuration. More particularly, display 126 is on-board the aircraft. One example of a wire health status is a list of all components 22 or major wiring systems being monitored, with a corresponding wire health indicator, such as a green, yellow, or red indication next to the respective component 22 or wiring system. Other examples include displaying wire health over time for each component 22 or wiring system, or displaying only those components/wiring systems having medium or high signals. These examples are provided for illustrative purposes, and the invention is not limited to a particular form of the wire health status.

Figure 13:
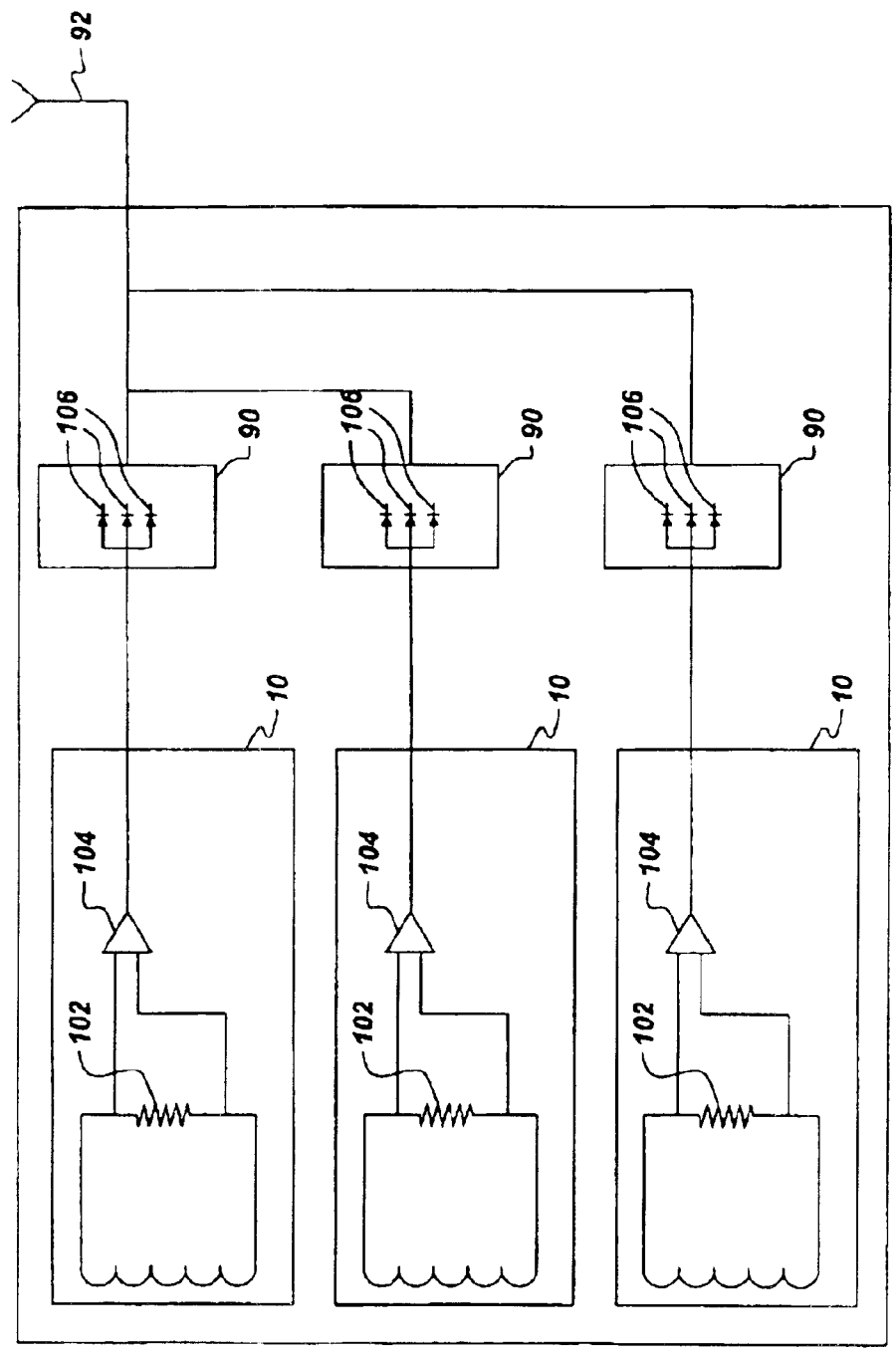
FIG. 13 depicts the monitoring unit of either FIG. 9 or 10 according to a more particular embodiment.

A particular on-board monitoring system 100 embodiment is described with reference to FIGS. 11 and 13. As shown in FIG. 13, on-board monitoring system 100 includes a number of monitoring units 60, 65. Each monitoring unit 60, 65 is configured to monitor a component 22 of aircraft wiring system 130 and includes at least one PD sensor 10. Exemplary monitoring units include in-line monitoring unit 60 and self-monitoring unit 65, which are illustrated in FIGS. 9 and 10, respectively, and are described in detail above. As indicated in FIG. 11, on-board monitoring system 100 further includes data acquisition system 40, which is configured to receive a number of monitoring signals from monitoring units 60, 65. More particularly, at least one of monitoring units 60, 65 further includes PD signal discriminator 90, for converting the monitoring signal to a multi-level monitoring signal, and transmitter 92, for transmitting the multi-level monitoring signal. For this embodiment, data acquisition system includes receiver 94 and memory 96, for receiving and storing the multi-level monitoring signal, respectively, and monitor 98, for transmitting an alert based on the multi-level monitoring signal. According to a more particular embodiment, on-board monitoring system 100 further includes at least one hard-wire connector 95 configured to connect at least one of the monitoring units 60, 65 to data acquisition system 40 for conveying the monitoring signal. Hard-wire connector 95 can be in place of or in addition to transmitter 92, for the respective monitoring unit 60, 65. As discussed above, hard-wire connections 95 are desirable for monitoring critical components 22 of aircraft wiring system 130.

Still more particularly, the component 22 monitored by monitoring unit 60, 65 of on-board monitoring system 100 includes a number of wires 28. For this embodiment, monitoring unit 60, 65 includes a number of PD sensors 10 and a number of PD signal discriminators 90, as indicated in FIG. 13. The number of PD sensors 10 and PD signal discriminators 90 shown in FIG. 13 is purely illustrative and will vary with the number of wires 28 being monitored for component 22. As indicated in FIG. 13, one PD signal discriminator 90 is provided for each PD sensor 10, and each PD sensor 10 monitors one of the wires 28. Each PD signal discriminator 90 converts the monitoring signals from a respective PD sensor 10 to respective multi-level monitoring signals. Transmitter 92 transmits each of the multi-level monitoring signals over a respective wireless channel.

A method embodiment for monitoring aircraft wiring system 130 includes acquiring a number of monitoring signals for a respective number of components 22 of aircraft wiring system 130 using a number of partial discharge PD sensors 10. The method further includes conveying the monitoring signals from at least one of the PD sensors 10 to data acquisition system 40. For example, monitoring signals from key components 22 are conveyed using hard-wired connectors 95 and monitoring signals are also conveyed in a wireless manner via transmitter 92.

To simplify monitoring and provide a quick means for detecting problematic wiring conditions and alerting personnel of such conditions, the method according to a particular embodiment further includes converting each of the monitoring signals to a multi-level monitoring signal. For this embodiment, each of the respective multi-level monitoring signals is transmitted over a respective wireless channel and stored in a memory 96 of data acquisition system 40. The method also includes transmitting an alert, if one of the multi-level monitoring signals indicates possible damage to the respective component 22. Still more particularly, the method further includes displaying a wiring health status for the components 22 based on the multi-level monitoring signals, as discussed above with respect to monitoring system 100.

An exemplary method for on-board monitoring of aircraft wiring system 130 includes acquiring a number of monitoring signals for a respective number of components 22 of aircraft wiring system 130 using a number of partial discharge PD sensors 10, and conveying the monitoring signals from at least one of the PD sensors 10 to data acquisition system 40, by hard wired or wireless means. The on-board monitoring method further includes converting each of the monitoring signals to multi-level monitoring signals, conveying the multi-level monitoring signals to data acquisition system 40, and storing the multi-level monitoring signals in memory 96 of data acquisition system 40. To warn aircraft personnel of possible damage to wiring system 130, the method also includes transmitting an alert, if one of the multi-level monitoring signals indicates possible damage to the respective component 22. For ease of monitoring the state of wiring system 130, the method further includes displaying a wiring health status for components 22 based on the multi-level monitoring signals.

Figure 14:
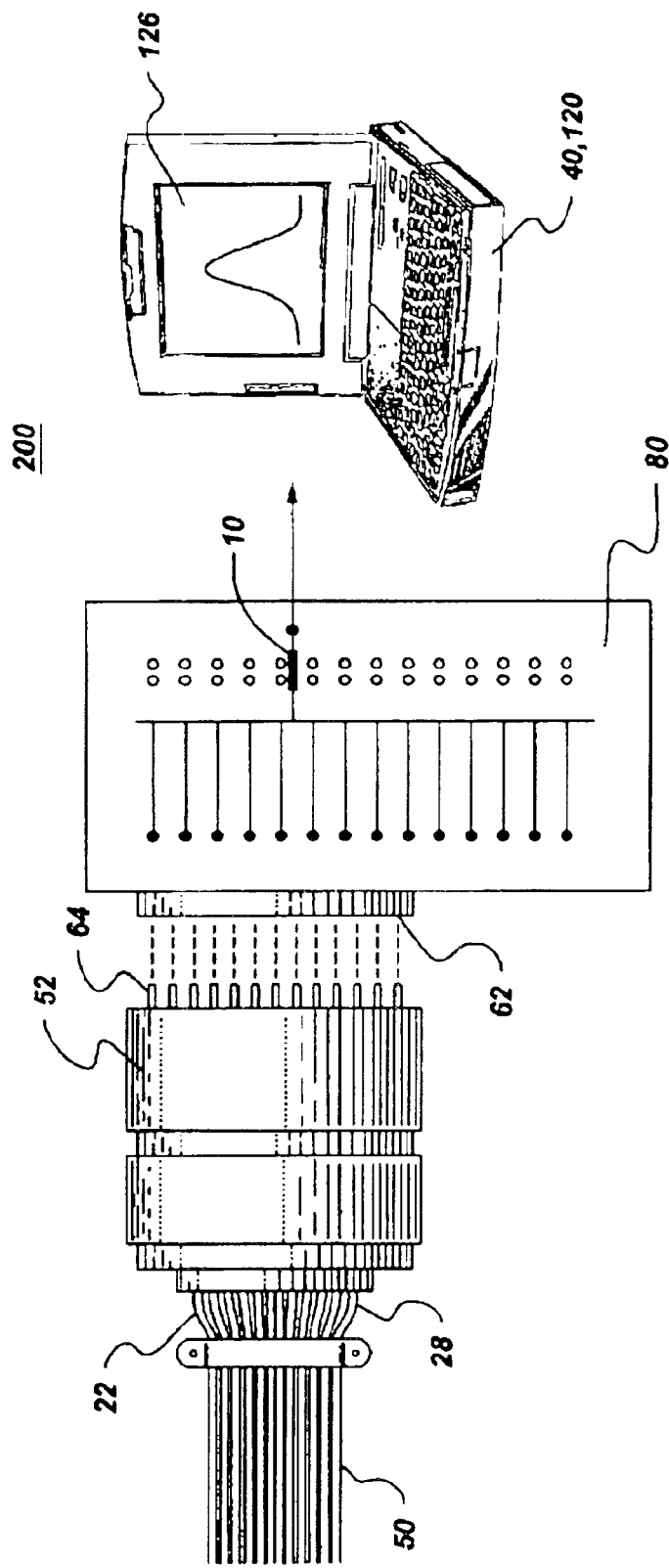
FIG. 14 illustrates a monitoring system for off-board monitoring and diagnostics.

Another monitoring system 200 embodiment is described with reference to FIG. 14. This embodiment is particularly beneficial for off-board monitoring and diagnosis of aircraft wiring system 130, namely for inspecting wires 28 when the aircraft is not in flight. As indicated in FIG. 14, monitoring system 200 includes a test interface 80, which is configured to connect to component 22 of aircraft wiring system 130. Test interface 80 includes at least one partial discharge (PD) sensor 10, which is configured to inspect component 22 and supply a signal. Exemplary PD sensors 10 include capacitive coupling sensor 12 or HFCT sensor 16. Monitoring system 200 further includes a data acquisition system 40, which is configured to receive the signal. Exemplary data acquisitions systems include computer 120, as indicated in FIG. 14. According to a particular embodiment, monitoring system 200 further includes display 126 for displaying the signal. As shown in FIG. 14, an exemplary display is a computer monitor.

As indicated in FIG. 14, this off-board monitoring embodiment is beneficially applied to a component 22 comprising a wire set 50, which includes at least one wire 28, and a connector 52, which is connected to the wire set 50. For this particular embodiment, test interface 80 is configured to matingly connect to connector 52, as indicated in FIG. 14. For example, test interface 80 includes at least one socket (not shown but indicated by reference numeral 62), for receiving a pin 64 of connector 52. Exemplary connectors 52 include 24 pins 64 and test interface includes a corresponding number of sockets 62. Of course, the number of pins 64 and sockets 62 varies for different cable assemblies. Beneficially, test interface 80 can be used with existing cable assemblies and thus can be used with existing aircraft wiring systems 130 to perform off-board monitoring and diagnostics.

More particularly for the off-board monitoring embodiment, wire set 50 includes a number of wires 28, as shown in FIG. 14, and test interface 80 is an automated multiplexing test interface 80, which is configured to automatically inspect each of the wires 28 using PD sensor 10. Presently, automated multiplexing test interfaces (AMTI) are used to measure cable resistances, and exemplary AMTIs for measuring cable resistances are commercially available from Eclypse International. By reconfiguring an AMTI to include PD sensor 10, the automatic switching mechanism of AMTI's can be used to connect PD sensor 10 to each wire 28 to perform partial discharge analysis on each wire. In this manner, AMTI 80 supplies signals for each of the wires 28. Beneficially, monitoring system 200 permits off-board monitoring and diagnostics of existing aircraft wiring systems 130 and facilitates quick isolation of a partial discharge indication for a specific wire 28.

Although monitoring systems 100, 200 have been described with respect to aircraft wiring system 130, monitoring systems 100, 200 and PS sensor 10 are also applicable to other wiring systems, for example to wiring systems in submarines, to wiring systems in space applications, such as space shuttles, and to wire systems in military vehicles.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A monitoring system comprising at least one partial discharge (PD) sensor, which is configured to monitor a component of an aircraft wiring system and to acquire a monitoring signal, wherein said PD sensor comprises a high frequency current transformer (HFCT) sensor encompassing the component, and wherein said HFCT sensor comprises a plurality of conductive leads formed on a substrate and a cap covering said leads and said substrate.

2. The monitoring system of claim 1, wherein the component comprises a conductive core surrounded by an insulating layer, and wherein said HFCT sensor extends around the insulating layer.

3. The monitoring system of claim 1, wherein the component comprises a plurality of wires, each wire comprising a conductive core surrounded by an insulating layer, wherein said HFCT sensor extends around the wires.

4. The monitoring system of claim 1, further comprising a monitoring unit which includes said PD sensor, wherein said monitoring unit comprises a self-monitoring unit, wherein the component comprises a wire set, which includes at least one wire and is connected to said self-monitoring unit, and wherein said PD sensor is configured to monitor the wire.

5. The monitoring system of claim 1, further comprising:
a monitoring unit which includes said PD sensor;
a data acquisition system, which is configured to receive the monitoring signal; and
at least one hard-wired connector configured to connect said monitoring unit to said data acquisition system for conveying the monitoring signal.

6. The monitoring system of claim 1 further comprising a monitoring unit which includes said PD sensor, wherein said monitoring unit further comprises a transmitter, which is configured to transmit the monitoring signal.

7. The monitoring system of claim 6, further comprising a data acquisition system, which comprises:
a receiver, which is configured to receive the monitoring signal; and
a memory, which is configured to store the monitoring signal.

8. A monitoring system comprising a monitoring unit that comprises:
at least one partial discharge (PD) sensor, which is configured to monitor a component of an aircraft wiring system and to acquire a monitoring signal,
a transmitter, which is configured to transmit the monitoring signal, and
a partial discharge (PD) signal discriminator, which is configured to convert the monitoring signal to a multi-level monitoring signal, wherein said transmitter is configured to transmit the multi-level monitoring signal.

9. The monitoring system of claim 8, further comprising a data acquisition system, which comprises:
a receiver, which is configured to receive the multi-level monitoring signal;
a memory, which is configured to store the multi-level monitoring signal; and
a monitor, which is configured to transmit an alert based on the multi-level monitoring signal.

10. The monitoring system of claim 9, further comprising a display, which is configured to display a wire health status based on the multi-level monitoring signal.

11. An on-board monitoring system comprising:
a plurality of monitoring units, each monitoring unit being configured to monitor a component of an aircraft wiring system and comprising at least one partial discharge (PD) sensor; and
a data acquisition system, which is configured to receive a plurality of monitoring signals from said monitoring units,
wherein at least one of said monitoring units further comprises:
a partial discharge (PD) signal discriminator, which is configured to convert the monitoring signal to a multi-level monitoring signal, and
a transmitter, which is configured to transmit the multi-level monitoring signal, and
wherein said data acquisition system comprises:
a receiver, which is configured to receive the multi-level monitoring signal,
a memory, which is configured to store the multi-level monitoring signal, and
a monitor, which is configured to transmit an alert based on the multi-level monitoring signal.

12. The on-board monitoring system of claim 11, wherein the respective component comprises a plurality of wires,
wherein said monitoring unit comprises a plurality of PD sensors and a plurality of PD signal discriminators, one PD signal discriminator being provided for a respective PD sensor,
wherein each of said PD sensors is configured to monitor a respective one of the wires,
wherein each of said PD signal discriminators is configured to convert each of the monitoring signals from a respective PD sensor to a respective multi-level monitoring signal, and
wherein said transmitter is configured to transmit each of the multi-level monitoring signals over a respective wireless channel.

13. The on-board monitoring system of claim 11, further comprising:
at least one hard-wired connector configured to connect at least one of said monitoring units to said data acquisition system for conveying the monitoring signal.

14. A method for monitoring an aircraft wiring system, said method comprising:
acquiring a plurality of monitoring signals for a plurality of components of the aircraft wiring system using a plurality of partial discharge (PD) sensors;
conveying the monitoring signals from at least one of the PD sensors to a data acquisition system;
converting each of the monitoring signals to a multi-level monitoring signal,
wherein said conveying step comprises transmitting each of the respective multi-level monitoring signals over a respective wireless channel and receiving the multi-level monitoring signals,
wherein said method further includes:
storing the multi-level monitoring signals in a memory of the data acquisition system; and
transmitting an alert, if one of the multi-level monitoring signals indicates possible damage to the respective component.

15. The method of claim 14, further comprising displaying a wiring health status for the components based on the multi-level monitoring signals.

16. A method for on-board monitoring of an aircraft wiring system, said method comprising:

acquiring a plurality of monitoring signals for a respective plurality of components of the aircraft wiring system using a plurality of partial discharge (PD) sensors;

conveying the monitoring signals from at least one of the PD sensors to a data acquisition system;

converting each of the monitoring signals to multi-level monitoring signals, conveying the multi-level monitoring signals to a data acquisition system;

storing the multi-level monitoring signals in a memory of the data acquisition system;

transmitting an alert, if one of the multi-level monitoring signals; indicates possible damage to the respective component; and displaying a wiring health status for the components based on the multi-level monitoring signals.

17. A monitoring system comprising:

a test interface, which is configured to matingly connect to a component of an aircraft wiring system, the component comprising a wire set, which includes a plurality of wires, and a connector connected to the wire set, said test interface comprising at least one partial discharge (PD) sensor, which is configured to monitor the component and acquire a monitoring signal, wherein said test interface further comprises an automated multiplexing test interface, which is configured to automatically monitor each of the wires using said PD sensor; and a data acquisition system, which is configured to receive the monitoring signal.

18. The monitoring system of claim 17, further comprising a display, which is configured to display the monitoring signal.

19. The monitoring system of claim 17, wherein said test interface is configured to matingly connect to the connector.

* * * * *